United States Patent [19]
Langley et al.

[11] Patent Number: 5,221,414
[45] Date of Patent: Jun. 22, 1993

[54] PROCESS AND SYSTEM FOR STABILIZING LAYER DEPOSITION AND ETCH RATES WHILE SIMULTANEOUSLY MAINTAINING CLEANLINESS IN A WATER PROCESSING REACTION CHAMBER

[75] Inventors: Rodney C. Langley; James L. Dale, both of Boise, Id.

[73] Assignee: Micron Technology, Inc., Boise, Id.

[21] Appl. No.: 730,483

[22] Filed: Jul. 16, 1991

[51] Int. Cl.⁵ .......................................... H01L 21/00
[52] U.S. Cl. .................................. 156/626; 156/643; 156/646; 156/345; 427/8; 427/248.1; 427/255.2; 427/255.6; 427/534; 427/585; 118/663; 118/712; 118/723
[58] Field of Search ............... 156/643, 646, 626, 345; 427/8, 39, 41, 255.1, 255.6, 225.2, 248.1; 118/698, 723, 712, 715, 664, 688

[56] References Cited
U.S. PATENT DOCUMENTS

| | | | |
|---|---|---|---|
| 4,414,057 | 11/1983 | Bourassa et al. | 156/643 |
| 4,985,114 | 1/1991 | Okudaira et al. | 156/643 |
| 5,002,793 | 3/1991 | Arai | 427/38 |

*Primary Examiner*—Thi Dang
*Attorney, Agent, or Firm*—William J. Bethurum

[57] ABSTRACT

Extraneous and undesirable particulate matter is suppressed in a reaction chamber for treating semiconductor materials by depositing a thin layer of polymeric or equivalent insulating material over the entire interior surfaces of the reaction chamber prior to any treatment therein of semiconductor wafers or the like. This process is repeated as necessary after the initial treatment of the wafers has begun, and this treatment will typically include the layer deposition and layer etching on the surfaces of the semiconductor wafers. The periodic intervals between subsequent polymer layer deposition within the reaction chamber is selected in proportion to measured etch or deposition rates therein to thereby optimize the stability and uniformity of these etch and deposition rates, while simultaneously maintaining a maximum degree of cleanliness within the reaction chamber and minimizing down time therefor. The above control of particulate tack-down film deposition may be carried out using a novel closed loop control system in which etch and film deposition rates are measured to generate an error signal, and this error signal is used to control a gas flow controller which in turn regulates the frequency of tack-down film deposition within the reaction chamber.

12 Claims, 2 Drawing Sheets

PROCESS AND SYSTEM FOR STABILIZING LAYER DEPOSITION AND ETCH RATES WHILE SIMULTANEOUSLY MAINTAINING CLEANLINESS IN A WATER PROCESSING REACTION CHAMBER

TECHNICAL FIELD

This invention relates generally to processes for treating semiconductor materials and more particularly to a process for depositing and etching layers of certain materials on the surfaces of silicon wafers with improved control over etching and deposition rates. The present invention is further directed to reducing particulate matter in wafer processing systems and thereby improving quality control over the treatment of semiconductor wafers.

BACKGROUND ART

In the treatment of semiconductor wafers used in the manufacture of a variety of semiconductor devices and integrated circuits, many different types of layer deposition and etching systems have been used and operated in such a manner as to introduce extraneous and undesirable particulate matter into the layer deposition and layer etching processes and into the related chemistries which are used in these systems. The source of this undesirable particulate matter is usually found in one or more elements within the interior housing of the chemical reaction chamber in which these layer deposition and etching processes are carried out.

For example, in a dry etch system, the cathode in the reaction chamber is typically made of graphite or a similar erodible material and will, over time and use, gradually decompose at the surface thereof. Similarly, other erodible materials within the reaction chamber such as carbon O-ring seals, aluminum and silicon electrodes, and ceramic shrouds can also be the source of this undesirable particulate matter. Such decomposition of the erodible hardware within the reaction chamber will in turn generate and free undesirable graphite or other particles into the interior of the reaction chamber. These extraneous particles will in turn be introduced into the gas phase or liquid phase reactions which are carried out in the etch chamber and thereby contaminate the chemical reactions taking place therein. In addition, the change in the original composition of the graphite electrodes also has the additional deleterious effect of changing both the etch rates and uniformity of wafer characteristics from batch to batch in a large scale wafer fabrication process.

All of the above phenomena serves to degrade semiconductor device quality and increase the length of equipment down time in order to permit adequate maintenance thereof which includes cleaning, gap checks and hardware changes. In addition, this phenomenon can also operate to reduce repeatability of results from batch to batch in a large scale wafer processing operation, and it also tends to reduce semiconductor device and integrated circuit yields.

DISCLOSURE OF INVENTION

The general purpose and principal object of the present invention is to provide a new and improved process for maintaining stability in etching rates and deposition rates for the etching and deposition layer processes carried out in a reaction chamber used for treating semiconductor materials, such as a batch of silicon wafers.

Another object of this invention is to provide a new and improved process of the type described which is operative to suppress particulate matter within a semiconductor wafer reaction chamber.

Another object of this invention is to provide a new and improved process of the type described which is operative to improve the quality and performance of the semiconductor devices and integrated circuits produced by the process.

Another object of this invention is to provide a new and improved process of the type described which is operative to increase repeatability of results from batch to batch or wafer to wafer in a large scale wafer processing operation, thereby also improving device and integrated circuit yields.

A further object of this invention is to provide a new and improved process of the type described which serves to increase the "up time" or actual operating time and wafer throughput for wafer treatment reaction chambers in which the process is used.

A novel feature of this invention is the provision of a closed loop servo system in which film etch or deposition rates are measured and such measurements are used to control a gas flow controller. The gas flow controller is operative to vary the frequency at which the tack-down film is applied to the exposed interior surfaces of the reaction chamber.

Another novel feature of this invention is the use of selected gases for forming the tack-down film within the reaction chamber. These gases contain elements which are compatible with the elements of the gases within the reaction chamber which are used to etch and deposit films on the wafers, and vice versa.

Another novel feature of this invention is the provision of a particulate tack-down film deposition process of the type described which simultaneously operates to maximize cleanliness within a wafer processing reaction chamber, thereby further enhancing device performance and process yields.

The above purpose, objects, and related novel features and advantages of this invention are achieved by the use of a particulate matter suppression process carried out in a chemical reaction chamber and which includes introducing one or more selected film forming reactant gases into the reaction chamber at periodic intervals during operation thereof. This process in turn causes a selected insulating material to deposit within the chamber and form a thin layer of insulating material over all of the interior surfaces of the reaction chamber. In this manner, the thin layer of insulating material operates to suppress particulate matter within the chamber which would otherwise result from the exposed interior erodible surfaces of the chamber and otherwise generate undesirable particles which would then be introduced into gas phase or liquid phase reactions being carried out within the chamber.

In a preferred embodiment of this invention, thin layer of particle suppressing material is a polymeric material, and the above novel particle suppression process further includes measuring the etching or deposition rates for the semiconductor wafers being processed at periodic intervals in a batch to batch wafer fabrication process. Thereafter, the periodic intervals of the polymer layer deposition inside the chamber are controllably spaced in proportion to the measured variations in etching or layer deposition rates within the chamber. In this manner, the stability and uniformity of etch rates and deposition rates from batch to batch in a large scale wafer fabrication process may be optimized.

The above brief summary of the invention together with its attendant objects, novel features and related advantages will become better understood with reference to the following detailed description of the accompanying drawings.

DETAILED DESCRIPTION OF THE PREFERRED EMBODIMENT

Figure 1:
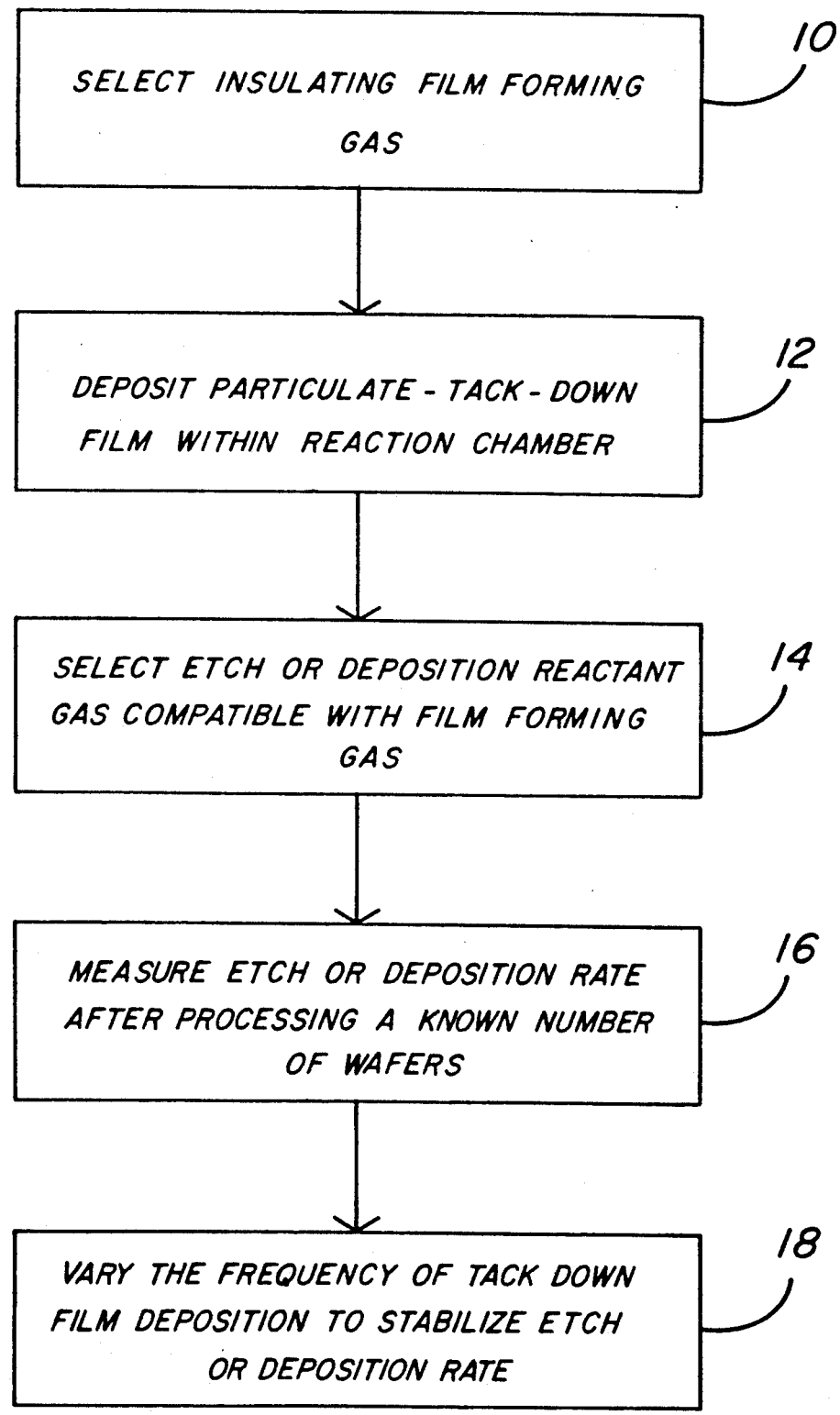
FIG. 1 is a process flow diagram which illustrates a preferred sequence of steps for carrying out this invention.
Figure 2:
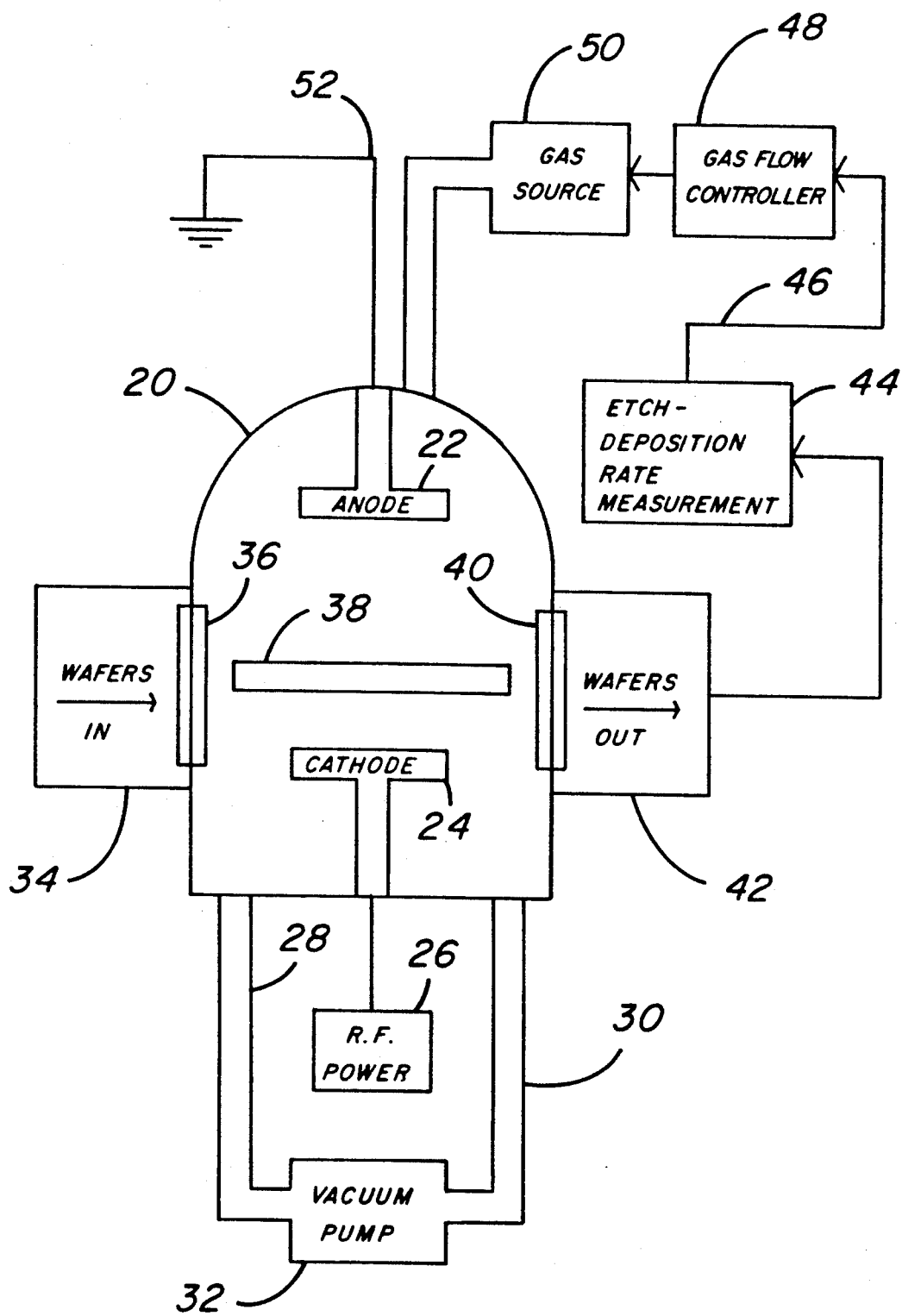
FIG. 2 is an abbreviated schematic cross section and functional level view of a dry etch reaction chamber and associated novel closed loop servo system in which the particle suppression process according to the present invention may be carried out.

Referring now in sequence to FIGS. 1 and 2, the process flow methodology shown in FIG. 1 represents a preferred sequence of process steps and a novel process combination upon which one or more claims herein are based. Initially, in step 10, an insulating film forming gas such as flouroform, $CHF_3$ or silicon tetrachloride, $SiCl_4$ or hexaflouroethane, $C_2F_6$, or carbon tetrachloride, $CCl_4$, is selected as the carbon-containing or silicon-containing or hydrogen-containing or chlorine containing gas which is to be introduced and reacted in either an etching or film deposition chamber to deposit on all of the interior surfaces of the chamber a particulate tack-down insulating film as indicated at step 12. This tack-down film will typically be either a polymeric film or a silicon-containing film such as silicon-dioxide.

Next in step 14, either an etch reactant gas or a film deposition reactant gas is selected to be compatible with the tack-down film forming gas and is introduced into the reaction chamber to either etch the surfaces of silicon wafers or to deposit thin films on the surfaces of the silicon wafers. Then, after a predetermined number of wafers have either been etched or film deposited as indicated at step 16, the etch or deposition rates for these wafers are measured and compared to a preferred etch or deposition rate. Based upon this comparison, the frequency of tack-down film deposition is then varied as indicated at step 18 in order to stabilize the etching or film deposition rates within the reaction chamber.

When the particulate tack-down film is deposited within the reaction chamber as indicated at step 12, it will be formed at a particular depth over all of the exposed surfaces of the reaction electrodes and other erodible components within the chamber. If this tack-down film has been deposited too thick or has its greater-than-desired thickness maintained by a higher-than-necessary frequency of tack-down film deposition steps, then this will tend to slow down the etch or deposition rates of the semiconductor wafers being processed between the film covered electrodes within the reaction chamber. On the other hand, if the tack-down films deposited within the reaction chamber are too thin and are too readily consumed by the reaction processes within the chamber or are redeposited therein at an insufficient frequency for aggressive reactions being carried out within the reaction chamber, then the etch and deposition rates of the semiconductor wafers therein will be significantly increased when these wafers are periodically checked and measured for the etch or deposition rates thereof after a known number of wafers have been processed as indicated in step 16 of FIG. 1.

Therefore, after the etch or deposition rate measurement step indicated in step 16 of FIG. 1 has been completed, this information is then processed in a closed loop manner to thereby in turn vary the frequency of tack-down film deposition either up or down to stabilize the etch or film deposition rate within the reaction chamber and thereby bring or null the film etch or deposition rate as indicated in step 18 of FIG. 1 to or toward a preferred etch or film deposition rate.

Referring now to FIG. 2, there is shown in an abbreviated schematic diagram a typical dry reaction chamber 20, such as a plasma enhanced chemical vapor deposition (PECVD) chamber in the case of film deposition on a wafer or a dry plasma etch chamber in the case of etching films on a wafer. Thus, the reaction chamber 20 shown in FIG. 2 is intended to generically represent both an etching chamber and a film deposition chamber, and the physical and operational differences between the two are well known to those skilled in the art of wafer processing. This reaction chamber 20 has an anode electrode 22 and a cathode electrode 24 between which wafers are treated with either an etching reaction or a film deposition reaction using one of many well known chemical reactions available in the art. Typically, the anode electrode 22 will be grounded and the cathode electrode 24 will be connected to a source of RF power 26.

The reaction chamber 20 is also provided with one or more vacuum lines 28 and 30 connected to a vacuum pump 32 used to pull a partial vacuum within the reaction chamber 20 down to a pressure of typically in the range of 1.0 to 10.0 Torr. In a typical wafer processing operation, a batch of silicon wafers will be loaded into a clean loading chamber 34 which has been flushed with an inert gas to remove all contaminants from the area receiving the batch of wafers prior to being loaded through an input door 36 and onto a wafer tray or boat 38 where the wafers are exposed to a plasma reaction which occurs between the two electrodes 22 and 24. After the completion of this plasma etch or film deposition reaction, the wafers are transported through a chamber exit door 40 and into a wafer unloading clean area 42 where conventional wafer handling clean room procedures are used.

After a certain number of these wafers have been treated within the reaction chamber 20, a sample or dummy wafer which has also been treated in the reaction chamber 20 will be transferred to an etch rate or deposition rate measurement station indicated at 44, and this measurement station 44 is utilized to in turn generate a gas flow controller error signal on line 46 at the input of a gas flow controller stage 48. This gas flow controller 48 is then operative to control the periodicity or frequency at which the selected insulating tack-down film forming gas in step 10 of FIG. 1 is introduced from the gas source 50 in FIG. 2 and through the gas flow line 52 into the plasma reaction chamber 20. Thus, the gas flow controller 48 operates to deposit the particulate tack-down film at a desired frequency within the reaction chamber 20 as indicated at step 12 in FIG. 1.

Instrumentation for use at station 44 for making the etch rate and film deposition rate measurements include interferometers and like reflected wavelength measuring equipment which are known to those skilled in the art and are sold commercially by Nanometrics, Inc. and Prometrics, Inc. of Santa Clara, Calif.

In operating the chamber 20 as a dry plasma etch chamber, the graphite electrodes 22 and 24 within the reaction chamber 20 are not the only source of particulate matter which is subject to attack by etchant and other reactant gases used in treating the silicon wafers within the reaction chamber 20. Other sources (not shown) of this particulate matter include graphite O-ring seals, metal boats carrying the silicon wafers, aluminum and silicon electrodes used in CVD deposition chambers, and certain ceramics which are used as shrouds to seal off cracks within the reaction chamber 20. Thus, when aggressive etchant gases such as nitrogen triflouride, $NF_3$, oxygen, $O_2$, and nitrous oxide, $N_2O$, are used to etch a plurality of silicon wafers, these aggressive etchant gases also attack the above mentioned sources of particulate matter and, for example, cause the graphite electrodes to "rain" graphite within the reaction chamber 20 and thereby produce uneven spots in the planar process being carried out on the wafers treated therein. This undesirable reaction also generates defects and uneven areas on the surfaces of the silicon wafers and many other kinds of abnormalities within the semiconductor devices being fabricated to the detriment of wafer quality and production yields.

However, in accordance with the present invention, the protective insulating tack-down layer, such as a layer of polymer material deposited over all of the interior surfaces of the reaction chamber 20, is consumed by the above identified etchants. Such consumption of the polymer layer does not produce a particulate problem, but rather has its by-products pumped out of the etching system through the lines 28 and 30 leading to the vacuum pump 32. The gases used to produce the polymer layers within the interior of the reaction chamber 20 include Freon gases such as flouroform, $CHF_3$, flouroethane, $C_2F_6$, and carbon tetrachloride, $CCl_4$. However, the present invention is not limited to the use and deposition of polymer layers alone and, if desired, silicon tetrachloride, $SiCl_4$, may be used at the gas source 50 to in turn decompose within the reaction chamber 20 and deposit a thin layer of silicon dioxide over all of the interior surfaces therein.

It is also important to understand that there needs to be a level of compatibility between the wafer etchant and film deposition gases used on one hand, and the tack-down layer source gases used on the other hand. For example, if an etchant reaction is being carried out in the reaction chamber using carbon tetrafloride, then it will be preferable to use $CHF_3$ or $C_2F_6$, also containing the elements of carbon and fluorine, in the particulate tack-down layer forming process within the reaction chamber 20. On the other hand, if the silicon wafers within the reaction chamber 20 are being etched with chlorine containing gases, $Cl_2$, then the compatible choice of tack-down layer producing gases at the gas source 50 will preferably be carbon tetrachloride, $CCl_4$, silicon tetrachloride, $SiCl_4$, or chloroform, $CHCl_3$, so that there is not produced an adverse chemical reaction within the chamber 20 between the elements of the tack-down layer producing gas on the one hand and the elements of the wafer treatment gas on the other hand. In addition, it may be preferable to match up these two different reactant and tack-down gases by looking at similarities in other gas characteristics such as, for example, boiling points.

As previously indicated, when the thickness of the tack-down film within the reaction chamber 20 increases, the plasma reaction energy between the anode and cathode electrodes 22 and 24 will decrease and thereby produce a corresponding reduction in, for example, etch and deposition rates being carried out in the chamber 20. Thus, if for example the etch rate measurement at station 44 in FIG. 2 indicates an etch rate of 3,000 Angstroms per minute prior to the formation of a tack-down layer within the chamber 20 and the etch rate thereafter drops sharply to 1,500 Angstroms per minute, this will be an indication of a thicker-than-desired tack-down layer being formed in the reaction chamber 20. This observation will cause the measurement stage 44 to generate an output error signal on line 46 which in turn causes the gas flow controller stage 48 to space out the tack-down layer depositions at a reduced frequency or periodicity.

On the other hand, when the etch and deposition rate measurement stage 44 begins to record a significant increase in the etch rate of the wafers being treated, this will in turn indicate that the tack-down polymer layers within the reaction chamber 20 have been substantially consumed, thereby producing a control error signal on line 46 at the input of the gas flow controller 48 which tells the gas flow controller 48 to increase the frequency or periodicity of the tack-down layer deposition step from, for example, an existing tack-down layer deposition of every one-hundred (100) wafers to a new tack-down layer deposition of every fifty (50) wafers.

In accordance with the novel teachings of the present invention, the up time for the operation of the reaction chamber 20 has been substantially increased, thereby also substantially increasing yields and throughputs in the etching or deposition process being carried out in the chamber. More particularly, approximately eighty-five percent (85%) of all down time for these reaction chambers is attributable to particulate problems, in comparison to the other fifteen percent (15%) of chamber down time which is attributable to mechanical failures. Thus, not only does the present process operate to maintain good stability over etch rates and deposition rates within the reaction chamber 20 and good statistical process control (SPC) over the etch and layer deposition processes being carried out in the reaction chamber 20, but it also simultaneously maximizes cleanliness in the chamber 20 by minimizing the above problem of particulate matter. This feature in turn simultaneously increases up times and throughputs for wafer fabrication processes carried out in many types of dry reaction chambers, of which the reaction chamber 20 configuration in FIG. 2 is but one example.

Various modifications may be made in and to the above described embodiment without departing from the spirit and scope of this invention. The present invention will prove useful in a wide variety of dry reaction chambers used for layer etching and layer deposition purposes, and these include etching systems which use reactive ion etchers, parallel plate etchers and magnetically enhanced ion etchers. Examples of film deposition systems include plasma enhanced chemical vapor deposition systems, atmospheric vapor deposition systems and low pressure chemical vapor deposition systems. In addition, the present invention may also be carried out using other and different tack-down layer producing gases and associated chemical reactions other than those specifically described above. Furthermore, the present invention is not limited to the etching and film deposition on silicon wafers and may instead be practiced using other semiconductive materials such as sapphire, Al₂O₃, and gallium arsenide, GaAs. In addition, the control of film deposition rates within the reaction chamber and system described above is not limited strictly to the servo loop operation of the gas flow controller and may also include the change in other system variables such as changes in RF power and temperature within the reaction chamber.

Finally, the present invention is not limited to the use of automatically operated closed loop servo feedback techniques wherein the error or null signal is automatically applied from the etch and deposition rate measurement station 44 to the gas flow controller 48, and may instead be used with open loop techniques where an operator makes the etch and deposition rate measurements at station 44, and then physically makes the appropriate adjustments to the gas flow controller 48. Accordingly, these and other design and operational modifications may be made in and to the above described embodiment without departing from the scope of the following appended claims.

We claim:

1. A process for stabilizing wafer processing conditions within a chemical reaction chamber used for treating semiconductor wafers by depositing and etching surface layers thereon, which comprises the steps of:
   a. introducing a selected film forming reactant gas into said chamber at periodic intervals of operation thereof, and thereby
   b. causing a selected insulating material to deposit within the interior of said chamber and form a thin layer of particulate tack-down material over the interior surfaces thereof, said particulate tack-down material is a film formed by the introduction into said chamber of said reactant gas which is a gas selected from the group consisting of CHF₃, C₂F₆, SiCl₄, CHCl₃ and CCl₄ whereby particulate matter otherwise generated by the operation of said surfaces is covered and prevented from being introduced into the gas phase or liquid phase reactions being carried out within said chamber.

2. The process defined in claim 1 which further includes:
   a. measuring the etch or deposition rates at periodic intervals in a batch to batch wafer fabrication process carried out in said chamber, and then
   b. spacing the periodic introduction of said particulate tack-down layer deposited within said chamber in proportion to the variation in etch rates or deposition layer rates within said chamber, thereby optimizing the uniformity and stability of etch rates and layer deposition rates from batch to batch in a large scale wafer fabrication process.

3. The process defined in claim 2 wherein said particulate tack-down material is a polymer formed by the introduction into said chamber of a gas selected from the group consisting of CHF₃, C₂F₆, or CCl₄.

4. The process defined in claim 2 wherein said particulate tack-down material is silicon dioxide formed by the introduction of SiCl₄ into said chamber.

5. The process defined in claim 2 wherein wafers within said reaction chamber are etched during said wafer fabrication process with gases selected from the group consisting of Cl₂ and CF₄.

6. A system for stabilizing wafer processing conditions within a chemical reaction chamber used for treating semiconductor wafers by depositing and etching surface layers thereon, which comprises:
   a. means for introducing a selected film forming reactant gas into said chamber at periodic intervals of operation thereof, and thereby causing a selected insulating material to deposit within the interior of said chamber and form a thin layer of particulate tack-down material over the interior surfaces thereof, said particulate matter otherwise generated by the operation of said surfaces is covered and prevented from being introduced into the gas phase or liquid phase reactions being carried out within said chamber,
   b. means for measuring the etch or deposition rates at periodic intervals in a batch to batch wafer fabrication process carried out in said chamber, and
   c. means connected to said measuring means for spacing the periodic introduction of said particulate tack-down layer deposited within said chamber in proportion to the variation in etch rates or deposition layer rates within said chamber, thereby optimizing the uniformity and stability of etch rates and layer deposition rates from batch to batch in a large scale wafer fabrication process.

7. The system defined in claim 6 wherein said spacing means includes a gas flow controller connected between the output of said measuring means and a gas source for supplying gases that produce said tack-down film at a controlled frequency.

8. In a wafer etch and deposition treatment system of the type wherein wafers are passed through a reaction chamber and exposed to reactant etch gases or to film deposition gases in the presence of exposed sources of particulate matter within said chamber, characterized in that said treatment system includes:
   a. means including a gas flow input port to said reaction chamber for passing a selected reactant gas into said reaction chamber and for depositing tack-down films on the inside surfaces of said reaction chamber,
   b. means for measuring film etch and deposition rates for wafers coming out of said reaction chamber, and
   c. control means conencted between said measuring means and said gas flow input port to said reaction chamber for controlling the frequency at which particulate matter tack-down films are deposited within said reaction chamber.

9. The treatment system defined in claim 8 wherein said control means includes:
   a. a gas flow controller conencted to receive a signal from said measuring means, and
   b. a source of tack-down film gas conencted between said gas flow controller and said reaction chamber for responding to signals received from said gas flow controller to introduce tack-down film gas into said reaction chamber at a controlled periodicity.

10. The system defined in claim 9 wherein said source of tack-down film gas includes a gas selected from the group consisting of CHF₃, C₂F₆, and CCl₄ useful in the production of polymer tack-down films within said reaction chamber.

11. The system defined in claim 9 wherein said source of tack-down film gas includes silicon tetrachloride, SiCl₄, for producing silicon dioxide films within said reaction chamber.

12. The system defined in claim 9 wherein said reactant gas includes etchant gases selected from the group consisting of CF₄ and Cl₂, and said source of tack-down film gas is selected from the group consisting of SiCl₄, CHCl₃, CCl₄, C₂F₆, and CHF₃.

* * * * *